(12) United States Patent
Oda et al.

(10) Patent No.: US 11,876,670 B2
(45) Date of Patent: Jan. 16, 2024

(54) DIAGNOSTIC APPARATUS

(71) Applicant: NIPPON TELEGRAPH AND TELEPHONE CORPORATION, Tokyo (JP)

(72) Inventors: Takuya Oda, Musashino (JP); Shokei Kobayashi, Musashino (JP); Akira Hirano, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 254 days.

(21) Appl. No.: 17/274,365

(22) PCT Filed: Aug. 26, 2019

(86) PCT No.: PCT/JP2019/033310
§ 371 (c)(1),
(2) Date: Mar. 8, 2021

(87) PCT Pub. No.: WO2020/054379
PCT Pub. Date: Mar. 19, 2020

(65) Prior Publication Data
US 2021/0328861 A1 Oct. 21, 2021

(30) Foreign Application Priority Data
Sep. 10, 2018 (JP) ................. 2018-168985

(51) Int. Cl.
*H04L 41/0695* (2022.01)
*G06N 7/01* (2023.01)
(Continued)

(52) U.S. Cl.
CPC ........ *H04L 41/0695* (2013.01); *G01R 31/002* (2013.01); *G01R 31/318566* (2013.01); *G06N 7/01* (2023.01)

(58) Field of Classification Search
CPC ............ H04L 41/0695; H04L 41/0631; H04L 41/0677; H04L 43/50; H04L 43/10;
(Continued)

(56) References Cited

U.S. PATENT DOCUMENTS 5,533,413 A * 7/1996 Kobayashi ............... G07C 3/00
73/865.9
2007/0280706 A1* 12/2007 Yasukawa .......... G03G 15/5079
399/9
(Continued)

FOREIGN PATENT DOCUMENTS

CN 107806690 A * 3/2018
JP H0250206 A * 2/1990
(Continued)

OTHER PUBLICATIONS

Stephane Gosselin et al., Application of Probabilistic Modeling and Machine Learning to the Diagnosis of FTTH GPON Networks, 2017 International Conference on Optical Network Design and Modeling (ONDM), 2017.

*Primary Examiner* — Catherine T. Rastovski
*Assistant Examiner* — Yossef Korang-Beheshti
(74) *Attorney, Agent, or Firm* — Harness, Dickey & Pierce, P.L.C.

(57) ABSTRACT

A fault diagnosis unit (42) of a fault diagnosis apparatus (4) performs a fault diagnosis of a communication network (2) with a probabilistic inference algorithm using information on the communication network (2) having been gathered by an NW monitoring unit (41). A diagnosis result determining unit (43) determines test items for confirming and determining a diagnosis result of the fault diagnosis. A test performing unit (44) performs a confirmation test of the determined test items. The diagnosis result determining unit (43) deter-
(Continued)

mines a likelihood of the diagnosis result of the fault diagnosis based on a result of the confirmation test.

6 Claims, 8 Drawing Sheets

(51) Int. Cl.
 *G01R 31/00* (2006.01)
 *G01R 31/3185* (2006.01)

(58) Field of Classification Search
 CPC .......... G01R 31/002; G01R 31/318566; G06N 7/01; G06F 11/22; G06Q 10/00
 See application file for complete search history.

(56) References Cited

U.S. PATENT DOCUMENTS

| | | | |
|---|---|---|---|
| 2015/0029562 A1* | 1/2015 | Yasui | H04N 1/00217 358/468 |
| 2015/0254125 A1 | 9/2015 | Kakui | |
| 2020/0005635 A1 | 1/2020 | Nagata et al. | |

FOREIGN PATENT DOCUMENTS

| | | | |
|---|---|---|---|
| JP | H0250206 A | | 2/1990 |
| JP | H06149576 A | * | 5/1994 |
| JP | 2007323455 A | | 12/2007 |
| JP | 2009193486 A | | 8/2009 |
| JP | 4668117 B2 | * | 4/2011 |
| JP | 2014134987 A | | 7/2014 |
| JP | 201838022 A | | 3/2018 |
| WO | WO-2018143237 A1 | | 8/2018 |

* cited by examiner

DIAGNOSTIC APPARATUS

CROSS-REFERENCE TO RELATED APPLICATIONS

This application is a 371 U.S. National Phase of International Application No. PCT/JP2019/033310 filed on Aug. 26, 2019, which claims priority to Japanese Application No. 2018-168985 filed on Sep. 10, 2018. The entire disclosures of the above applications are incorporated herein by reference.

TECHNICAL FIELD

The present invention relates to a diagnostic apparatus.

BACKGROUND ART

In communication networks, as virtualization and the like become more prevalent in order to provide various services, networks are becoming more and more complex and, accordingly, increasingly sophisticated maintenance operations are being required. In particular, in the field of fault diagnosis, creating a probabilistic model from monitoring information and fault cases of a network and performing fault diagnosis are being considered.

FIG. 7 is a diagram showing a conventional fault diagnosis system. An operations manager performs NW monitoring in which various kinds of information (alert information, counter information, transmission quality information, and the like) in a communication network are gathered via a management network and monitored. The fault diagnosis system executes a fault diagnosis process using the gathered information as input and diagnoses a presence or an absence of an occurrence of a fault (when a fault is present, a cause thereof) in the communication network under operation. Opportunities to execute the fault diagnosis include a change in monitoring information, periodic implementation, and arbitrary timings set by an operations manager.

While various inference algorithms are used in a fault diagnosis process, a fault diagnosis process using a probabilistic model using a Bayesian network as an inference algorithm will be shown herein as a conventional example. A Bayesian network is a probabilistic inference model which expresses a cause-and-effect relationship as a probability and which represents an inference of a complicated cause-and-effect relationship by a directed acyclic graph structure and a relationship between each "cause" and "effect" by a conditional probability.

FIG. 8 is a diagram showing a simple example of a Bayesian network. A Bayesian network is constituted by nodes and arrows. Each node has a probabilistic variable P with respect to a given event. In addition, an arrow between nodes indicates a cause-and-effect relationship between events. A node at a source of the arrow is referred to as a parent, a node at a destination of the arrow is referred to as a child, and the nodes have a parent-child relationship. In the diagram, since the nodes A and B do not have parents, the nodes A and B respectively have probabilistic variables P (A) and P (B) of single events as probabilistic variables. In addition, since parent-child relationships are present at other nodes J, L, and M, the nodes J, L, and M respectively have conditional probabilities P (J|A, B), P (L|J), and P (M|J) which are dependent on parent nodes as probabilistic variables. The relationship/probabilistic variables are set prior to the fault diagnosis process based on fault cases or monitoring data that are considered a target, by a parameter adjustment by maintenance personnel, or the like.

For example, an event of occurrence of a fault F1 is associated with the node A, an event of occurrence of a fault F2 is associated with the node B, an event of an apparatus alert M1 being reported upon the occurrence of the fault F1 or the fault F2 is associated with the node J, an event of an alert of an intra-apparatus device D1 indicating an abnormality when the apparatus alert M1 is reported is associated with the node L, and an event of an alert of an intra-apparatus device D2 indicating an abnormality when the apparatus alert M1 is reported is associated with the node M, in which case a probabilistic variable of each node is given based on prior fault cases and monitoring information. In addition, the alerts of the intra-apparatus devices D1 and D2 are gathered as monitoring information and, based on the information, the probabilities of occurrences of the fault F1 and the fault F2 are determined and evaluated based on the given relationship/probabilistic variables. Performing a fault diagnosis using a probabilistic model in this manner enables a fault cause to be estimated even in the case of complicated faults that are difficult to determine by hand. An example of performing a fault diagnosis using a Bayesian network is described in NPL 1.

Such a fault diagnosis system using a probabilistic model derives a fault cause with a highest probability based on given monitoring information. In this case, a fault cause refers to a fault (in the example described above, the faults F1 and F2 that are events associated with the nodes A and B) which causes events (in the example described above, the apparatus alert M1, the alert of the intra-apparatus device D1, and the alert of the intra-apparatus device D2 which are events associated with the nodes J, L, and M) observed in monitoring information. However, whether or not the fault estimated to be the fault cause is actually occurring is not comprehended and a separate confirmation operation is required when performing an actual fault response.

CITATION LIST

Non Patent Literature

[NPL 1] S. Gosselin, J. Courant, S. R. Tembo, S. Vaton, "Application of Probabilistic Modeling and Machine Learning to the Diagnosis of FTTH GPON Networks", 2017 International Conference on Optical Network Design and Modeling (ONDM) Conference Proceedings, 2017

SUMMARY OF THE INVENTION

Technical Problem

As described above, while a fault diagnosis system using a probabilistic model which represents conventional art is capable of deriving a most probable fault cause or a fault location, whether or not a fault that is the fault cause or a fault at the fault location is actually occurring cannot be confirmed by only a fault diagnosis. Therefore, a diagnosis result must be confirmed before actually responding to a fault, which creates problems such as the need for manpower to perform a confirmation operation and a risk when the diagnosis result is wrong (such as setting off a separate fault due to an erroneous fault response).

In consideration of the circumstances described above, an object of the present invention is to provide a diagnostic apparatus capable of confirming a likelihood of whether an event obtained by a diagnosis using a probabilistic model is actually occurring at a diagnosis target.

Means for Solving the Problem

An aspect of the present invention is a diagnostic apparatus including: a state estimating unit which estimates a state of a diagnostic target using a probabilistic inference algorithm having one or more probabilistic inference steps; a test performing unit which performs a verification test for verifying the estimated state; and a determining unit which determines a likelihood of the estimated state based on a test result of the verification test.

An aspect of the present invention is the diagnostic apparatus described above, wherein when the determining unit determines that there is a difference between a state of the diagnostic target obtained based on the test result of the verification test and the state estimated by the state estimating unit, the determining unit makes a transition to the probabilistic inference step in which the difference had occurred and instructs the state estimating unit to estimate a state of the diagnostic target.

An aspect of the present invention is the diagnostic apparatus described above, further including an inference process changing unit which, when the determining unit determines that there is a difference between a state of the diagnostic target obtained based on the test result of the verification test and the state estimated by the state estimating unit, corrects a probability of reaching the estimated state so as to match the test result from the probabilistic inference step in which the difference had occurred.

An aspect of the present invention is the diagnostic apparatus described above, wherein the probabilistic inference algorithm is a state estimation algorithm that uses a Bayesian network.

An aspect of the present invention is the diagnostic apparatus described above, including a plurality of combinations of one or more of the state estimating units, one or more of the test performing units, and one or more of the determining units, and further including an overall determining unit which determines the state of the diagnostic target using a state estimated by the state estimating unit and a result of a determination made with respect to the state by the determining unit in each of the combinations.

An aspect of the present invention is the diagnostic apparatus described above, wherein the diagnostic target is a communication network, and the state estimating unit estimates a state in which a fault is occurring in the communication network.

Effects of the Invention

According to the present invention, a likelihood of whether an event obtained by a diagnosis using a probabilistic model is actually occurring at a diagnosis target can be confirmed.

DESCRIPTION OF EMBODIMENTS

Hereinafter, embodiments of the present invention will be described in detail with reference to the drawings. A diagnostic apparatus according to the present embodiments has a test function which estimates a state of a diagnostic target using a probabilistic inference algorithm and which verifies whether the estimated state is occurring in the diagnostic target, and improves likelihood of the estimated state. Hereinafter, a case where the diagnostic target is a communication network and the diagnostic apparatus is a fault diagnosis system which performs a fault diagnosis of the communication network will be described as an example.

First Embodiment

A first embodiment of the present invention will be described with reference to FIGS. 1 and 2.

Figure 1:
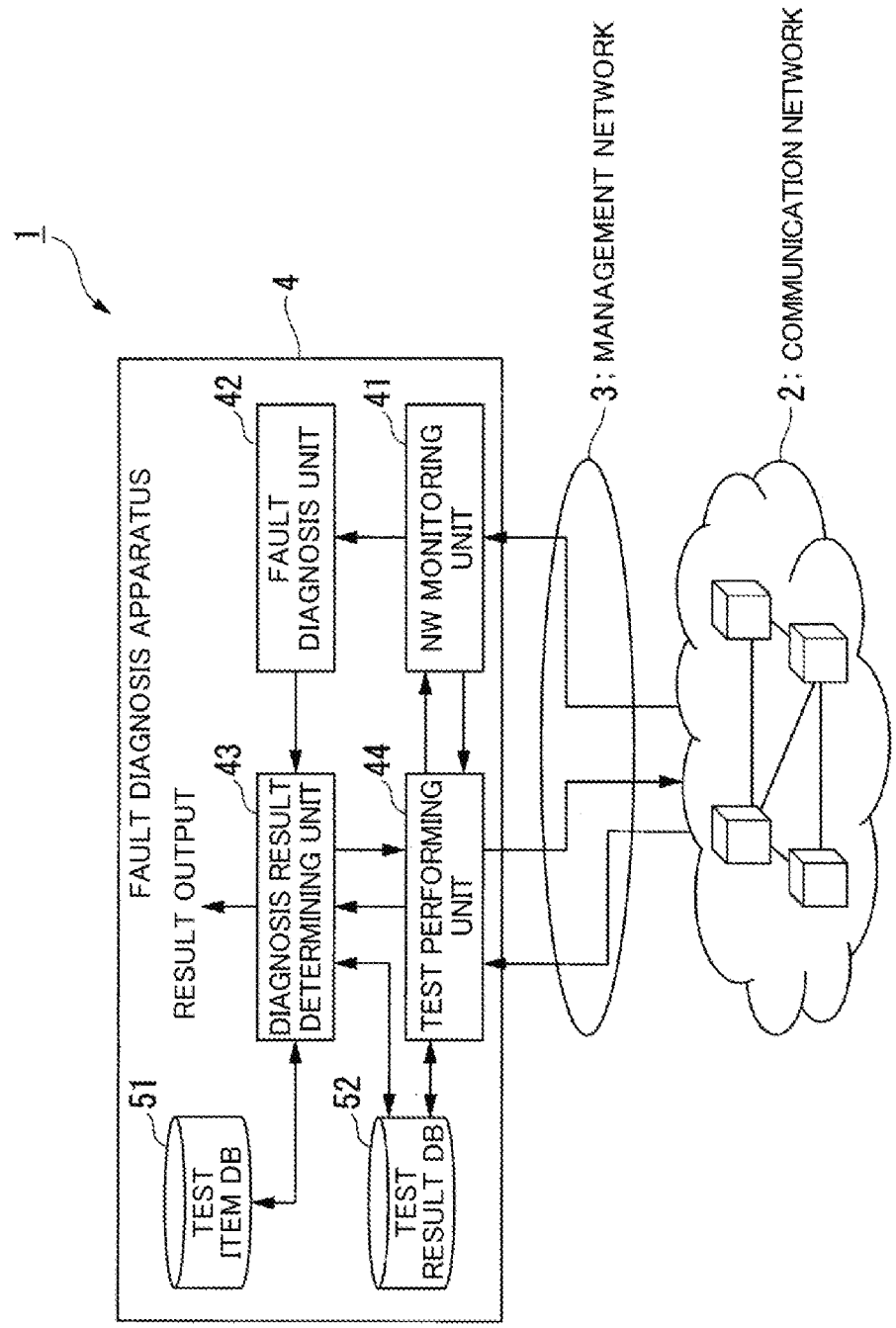
FIG. 1 is a configuration diagram of a fault diagnosis system according to a first embodiment of the present invention.
Figure 7:
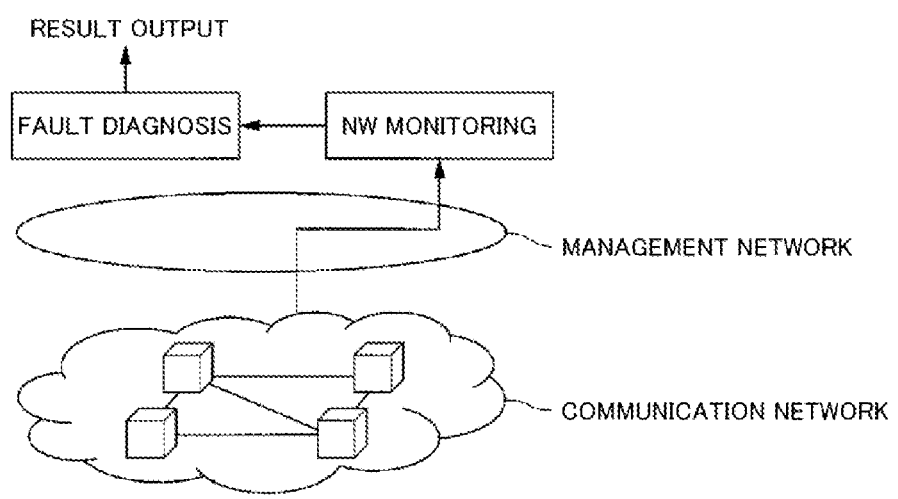
FIG. 7 is a diagram showing a conventional fault diagnosis system.

FIG. 1 is a configuration diagram of a fault diagnosis system 1 according to the present embodiment. The fault diagnosis system 1 includes a communication network 2, a management network 3, and a fault diagnosis apparatus 4. The fault diagnosis system 1 shown in FIG. 1 is an example in which a representative functional configuration of the present embodiment is adapted to a fault diagnosis system according to conventional art shown in FIG. 7. The fault diagnosis system 1 is equipped with a test function that confirms an actual state in the communication network 2 in accordance with a result of a fault diagnosis having been performed with respect to the communication network 2 in a similar manner to a fault diagnosis system according to conventional art.

The communication network 2 is, for example, a network constituted by a plurality of communication apparatuses. The management network 3 is a network that relays data transmitted and received between the communication network 2 and the fault diagnosis apparatus 4.

The fault diagnosis apparatus 4 includes an NW monitoring unit 41, a fault diagnosis unit 42, a diagnosis result determining unit 43, a test performing unit 44, a test item DB 51, and a test result DB 52. The NW monitoring unit 41 gathers various kinds of information (alert information, counter information, transmission quality information, and the like) in the communication network 2 via the management network 3 and stores the information. For example, the NW monitoring unit 41 includes an NW monitoring function that is similar to that of the conventional fault diagnosis system shown in FIG. 7. The fault diagnosis unit 42 executes a fault diagnosis process included in the conventional fault diagnosis system shown in FIG. 7. In other words, based on information gathered by the NW monitoring unit 41, the fault diagnosis unit 42 diagnoses a fault in the communication network 2 using a Bayesian network or the like. The fault diagnosis unit 42 obtains a presence or absence of an occurrence of a fault, and when a fault has occurred, a cause, an occurrence location, and the like thereof as a diagnosis result (hereinafter, also described as a fault diagnosis result).

The diagnosis result determining unit 43 confirms and determines a state of the communication network 2 based on a result of the fault diagnosis by the fault diagnosis unit 42. The diagnosis result determining unit 43 determines test items for confirming and determining the state of the communication network 2 and notifies the test performing unit 44 of the test items. The test performing unit 44 performs a confirmation test of the test items determined by the diagnosis result determining unit 43 and notifies the diagnosis result determining unit 43 of a test result. The test item DB 51 stores data of test items in accordance with a fault diagnosis result. The test result DB 52 stores data of a result of the confirmation test executed by the test performing unit 44.

It should be noted that the fault diagnosis apparatus 4 is realized by one or a plurality of computer apparatuses. When the fault diagnosis apparatus 4 is realized by a plurality of computer apparatuses, which computer apparatus is to have which functional unit can be arbitrarily determined. Alternatively, one functional unit may be realized by a plurality of computer apparatuses. In this case, the diagnosis result determining unit 43 and the test performing unit 44 are computational resources such as a server group, a cloud, or the like to be directly or indirectly connected to the management network 3.

Figure 2:
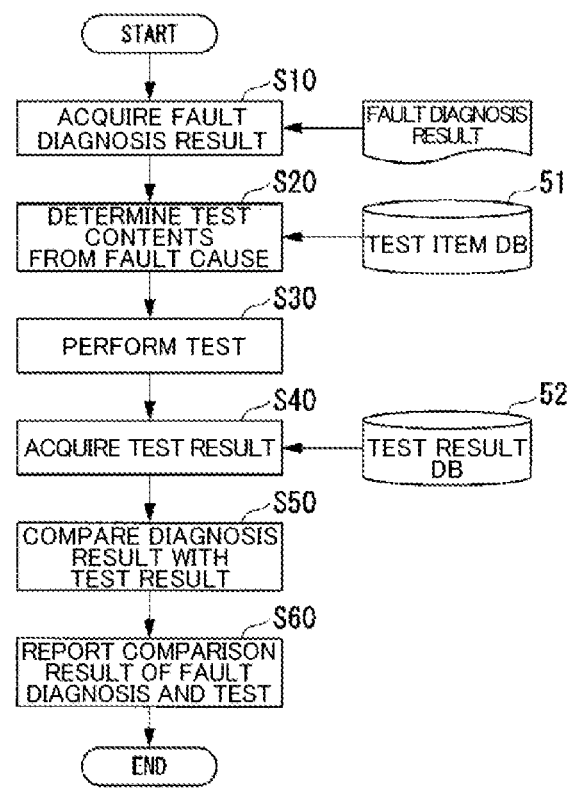
FIG. 2 is a flow chart representing an operation example of the fault diagnosis system according to the first embodiment.

FIG. 2 is a diagram that represents, in a flow chart format, an operation example of the fault diagnosis apparatus 4 after a fault diagnosis result is reported by the fault diagnosis unit 42. A specific example in a case where an apparatus fault of an apparatus A has occurred in the communication network 2, an alert information thereof is gathered by the NW monitoring unit 41, and a determination is performed by the fault diagnosis unit 42 will now be described with reference to FIG. 2.

The NW monitoring unit 41 gathers information (a link state, apparatus alive monitoring information, and the like) of a monitoring target from the communication network 2. The information on the monitoring target includes alert information of an apparatus fault. The fault diagnosis unit 42 performs a diagnosis of a fault using the information gathered by the NW monitoring unit 41. For example, an algorithm using a Bayesian network that is expressed by a probabilistic model is used for the diagnosis. Upon performing the determination, an algorithm is determined in advance based on fault information, monitoring information, and the like, and a present event is determined using the determined algorithm.

Let us assume that, as a result of the fault diagnosis, it is determined that the apparatus A has failed. The diagnosis result determining unit 43 receives information on a fault diagnosis result that reads "the apparatus A has failed" from the fault diagnosis unit 42 (step S10). In this case, when information on a fault cause is set in the fault diagnosis result, it is assumed that the information on a fault cause includes information on the presence or absence of a fault occurrence that reads "fault is present". Subsequently, the diagnosis result determining unit 43 refers to the test item DB 51 and creates test items for confirming whether or not the apparatus A has really failed (step S20). In this case, it is assumed that a confirmation test is to be performed which includes three items, namely, "item (1): state confirmation of apparatus A from management network 3", "item (2): state confirmation of whether apparatus B that is adjacent network-wise to apparatus A can communicate with apparatus A", and "item (3): confirmation of alert information of apparatus fault of apparatus A". The diagnosis result determining unit 43 notifies the test performing unit 44 of contents of the confirmation test which indicate the three determined items.

The test performing unit 44 performs the items of the notified confirmation test (step S30). Since the notified confirmation test includes test contents of the three items, the test performing unit 44 performs the following three tests and obtains results thereof.

Item (1): The test performing unit 44 confirms the state of the apparatus A in the communication network 2 via the management network 3. In this case, a fault of the apparatus A produces a result of inaccessible.

Item (2): The test performing unit 44 issues an instruction to the apparatus B via the management network 3 and causes communication confirmation (for example, Ping) to be executed from the apparatus B to the apparatus A. In this case, a fault of the apparatus A produces a result of also inaccessible from the apparatus B and communication cannot be confirmed.

Item (3): The test performing unit 44 acquires alert information of the apparatus A from the NW monitoring unit 41. In this case, since the NW monitoring unit 41 has gathered and stored the alert information of the apparatus A, detection of the alert information of the apparatus A can be confirmed.

After performing the three items of the confirmation test, the test performing unit 44 notifies the diagnosis result determining unit 43 of a test performance result thereof (item (1): inaccessible, item (2): no communication, and item (3): alert information available) (step S40).

When the diagnosis result determining unit 43 receives the test performance result having been notified from the test performing unit 44, the diagnosis result determining unit 43 compares a result of a fault of the apparatus A having been diagnosed by the fault diagnosis performed by the fault diagnosis unit 42 with the test performance result (step S50). The confirmation test of the three items is performed based on the fault diagnosis result to the effect that the apparatus A has failed and an event of a failure of the apparatus A is satisfied by all of the items. Accordingly, the diagnosis result determining unit 43 determines that the fault diagnosis result to the effect that the apparatus A has failed has been confirmed. Finally, the diagnosis result determining unit 43 outputs a result that combines the fault diagnosis result "the apparatus A has failed" with the confirmation result "failure of the apparatus A has been confirmed" (step S60). The output of the result may be a notification to an operation or may be a trigger to another system. Alternatively, the result may be simply stored as data in a storage apparatus provided inside or outside the fault diagnosis apparatus 4.

The diagnosis result determining unit 43 and the test performing unit 44 may execute the confirmation process of a fault diagnosis result described above with input of a fault diagnosis result from the fault diagnosis unit 42 as a trigger. Once the confirmation process starts, the diagnosis result determining unit 43 acquires the fault diagnosis result from the fault diagnosis unit 42 or from a data region in which fault diagnosis results by the fault diagnosis unit 42 are stored. The diagnosis result determining unit 43 determines test contents (test items, a test target location, and the like) of the confirmation test in accordance with contents of the acquired fault diagnosis result. For example, a data set that associates a fault cause, a fault location, or a combination thereof with test items may be prepared and registered in the test item DB 51 in advance. In the test item determination process, the diagnosis result determining unit 43 determines test contents such as test items and a test target location in accordance with a fault cause or a fault location indicated in the diagnosis result from a correspondence in the data set registered in advance in the test item DB 51. It should be noted that test items include communication confirmation (for example, confirmation using the Internet Control Message Protocol) of a communication path, confirmation of parameters with respect to an apparatus, a device, or a communication path, confirmation of an intra-apparatus log, a system log, or an application log, and confirmation of information related to operation management or maintenance (for example, Ethernet Operations, Administration and Maintenance).

After the determination of test contents by the diagnosis result determining unit 43, the test performing unit 44 performs a confirmation test with respect to an apparatus or a communication path that is a target. When target data included in the confirmation test has already been gathered by the NW monitoring unit 41, the information may be obtained from the NW monitoring unit 41 as a test result. After the confirmation test is performed by the test performing unit 44, the diagnosis result determining unit 43 gathers a test result thereof. As the test result, a log during performance of the test or the like may be directly used. Alternatively, after temporarily storing the test result in a separate storage region (for example, the test result DB 52), a relevant test result may be acquired from the storage region. After gathering a test result necessary for confirming the fault diagnosis result, the diagnosis result determining unit 43 compares the fault diagnosis result with a state of a network which is signified by the test result. The diagnosis result determining unit 43 outputs a comparison result together with the fault diagnosis result.

When the fault diagnosis result includes fault causes (such as a fault cause with a second highest probability) other than a most probable fault cause candidate, the fault diagnosis apparatus 4 may perform a confirmation test in a similar manner with respect to the other fault causes. Alternatively, the fault diagnosis apparatus 4 may perform a confirmation test with respect to a fault cause that differs from a fault cause on which a state comparison has been performed only when a difference occurs in a state comparison result after the confirmation test with respect to the one fault cause.

According to the present embodiment, a likelihood of a fault diagnosis result can be confirmed.

Second Embodiment

In the first embodiment, a diagnosis result of a fault diagnosis and a result of a confirmation test are compared with each other and a comparison result thereof and the diagnosis result are reported. In a second embodiment, when a difference occurs between a diagnosis result and a result of a confirmation test, a further fault diagnosis and a confirmation test are performed to improve accuracy of identifying a fault cause. The second embodiment will now be described with reference to FIGS. 3 and 4.

Figure 3:
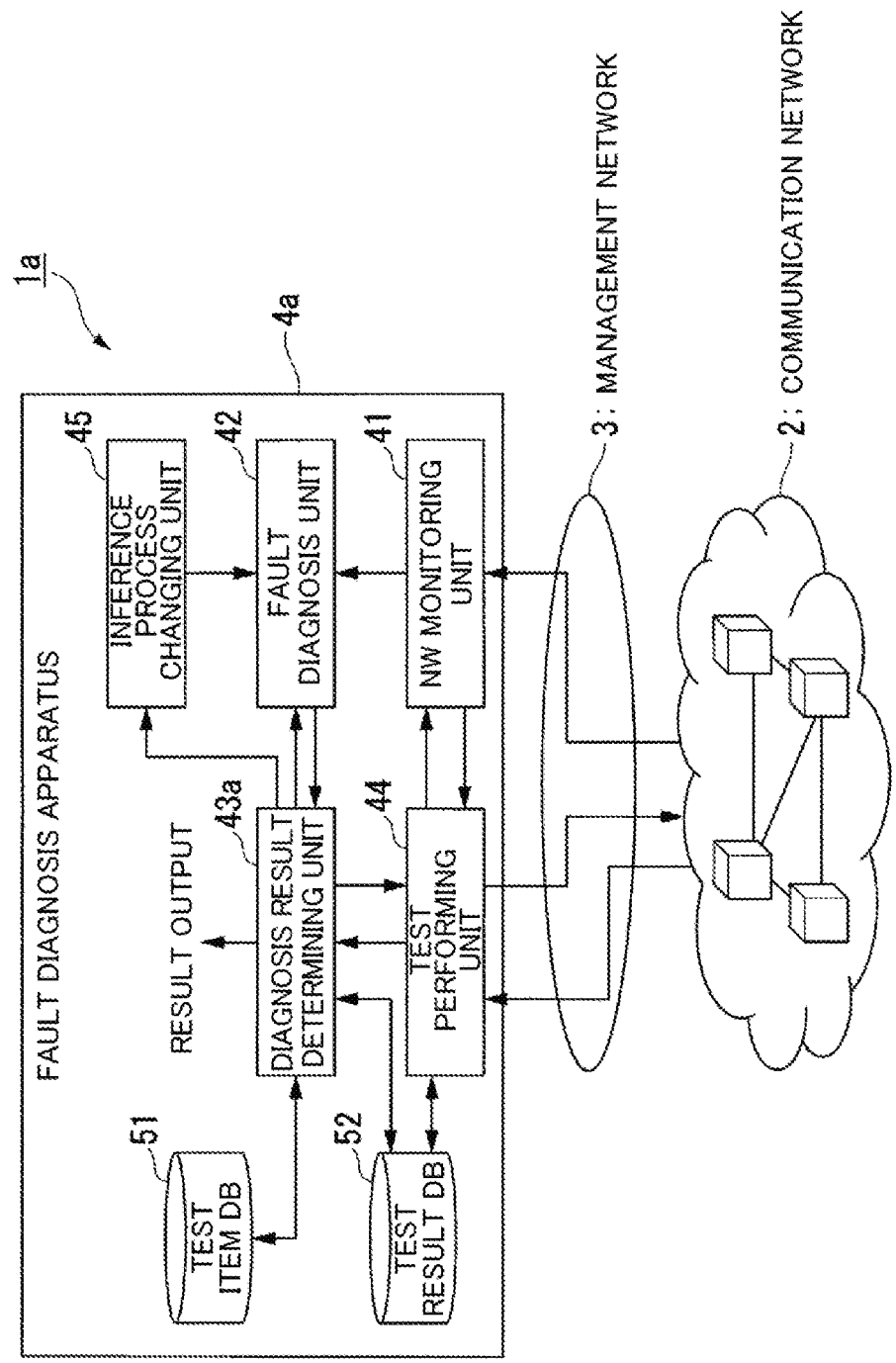
FIG. 3 is a configuration diagram of a fault diagnosis system according to a second embodiment.

FIG. 3 is a diagram showing a configuration of a fault diagnosis system 1*a* according to the present embodiment. The fault diagnosis system 1*a* shown in FIG. 3 is an example in which a functional configuration that enables the fault diagnosis system according to conventional art shown in FIG. 7 to perform a re-execution of a fault diagnosis when a difference occurs in state estimation after performing a confirmation test and a change to an inference process used by the fault diagnosis function. In FIG. 3, same portions as the fault diagnosis system 1 according to the first embodiment shown in FIG. 1 are denoted by same reference signs and descriptions thereof will be omitted. The fault diagnosis system 1*a* shown in FIG. 3 differs from the fault diagnosis system 1 shown in FIG. 1 in that the fault diagnosis system 1*a* includes a fault diagnosis apparatus 4*a* instead of the fault diagnosis apparatus 4.

The fault diagnosis apparatus 4*a* includes the NW monitoring unit 41, the fault diagnosis unit 42, a diagnosis result determining unit 43*a*, the test performing unit 44, an inference process changing unit 45, the test item DB 51, and the test result DB 52. The diagnosis result determining unit 43*a* determines test contents of a confirmation test based on a result of a fault diagnosis by the fault diagnosis unit 42, and confirms and determines a state of the communication network 2 based on a state comparison between the result of the fault diagnosis and a result of the confirmation test. Furthermore, when the diagnosis result determining unit 43*a* determines that a difference has occurred in the state comparison, the diagnosis result determining unit 43*a* instructs the fault diagnosis unit 42 to re-execute a diagnosis. The test performing unit 44 performs a confirmation test of the test contents determined by the diagnosis result determining unit 43*a*. The inference process changing unit 45 changes an inference process in the fault diagnosis unit 42 based on an instruction from the diagnosis result determining unit 43*a*.

It should be noted that the fault diagnosis apparatus 4*a* is realized by one or a plurality of computer apparatuses. When the fault diagnosis apparatus 4*a* is realized by a plurality of computer apparatuses, which computer apparatus is to have which functional unit can be arbitrarily determined. Alternatively, one functional unit may be realized by a plurality of computer apparatuses. In this case, the inference process changing unit 45 is a computational resource such as a group of servers or a cloud that is connected to the diagnosis result determining unit 43*a*.

Figure 4:
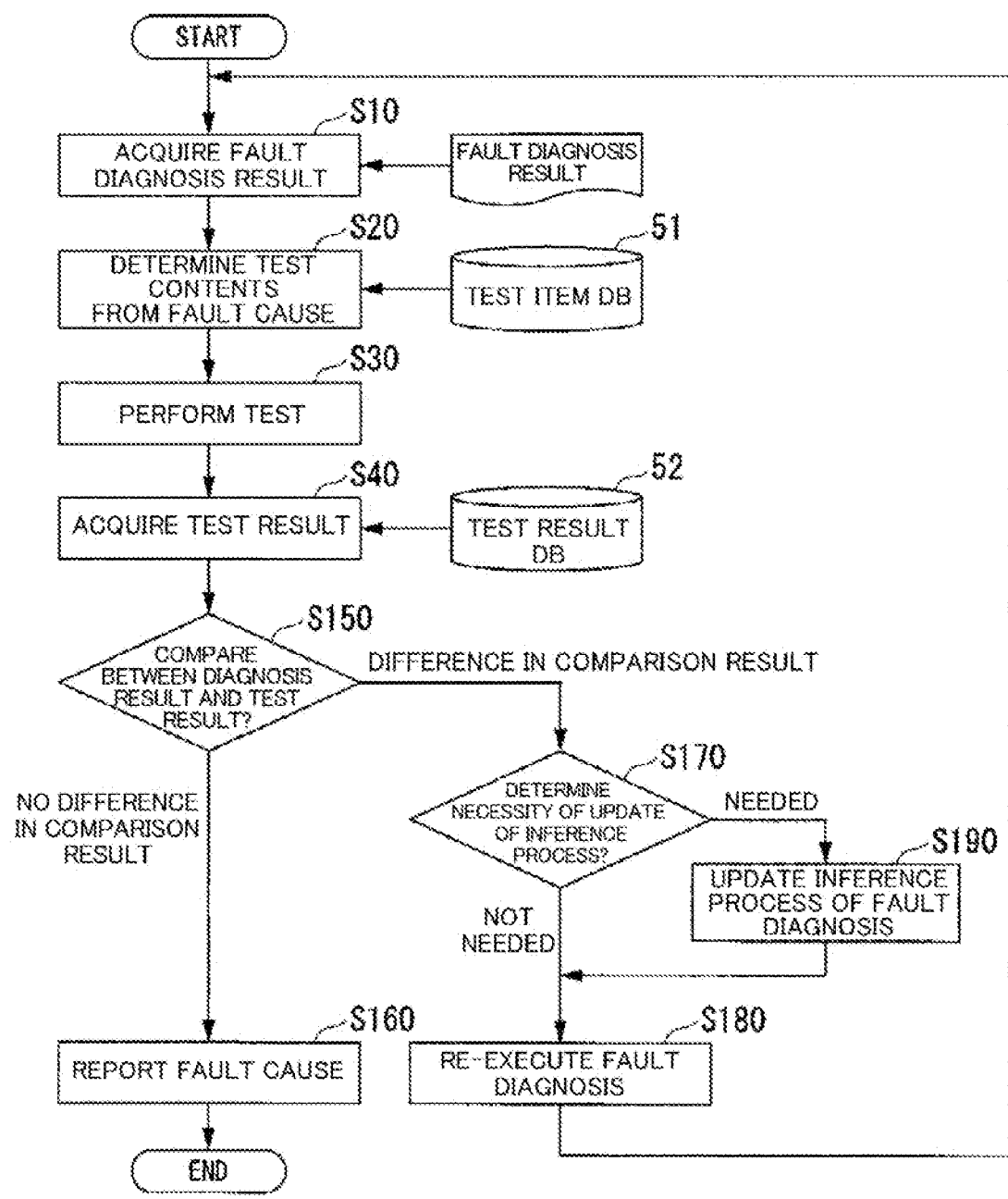
FIG. 4 is a flow chart representing an operation example of the fault diagnosis system according to the second embodiment.

FIG. 4 is a diagram that represents, in a flow chart format, an operation example of the fault diagnosis apparatus 4*a* after a fault diagnosis result is reported by the fault diagnosis unit 42*a*. In FIG. 4, same operations as the operations of the first embodiment shown in FIG. 2 are denoted by same reference signs and descriptions thereof will be omitted.

Operations from "acquisition of fault diagnosis result" in step S10 to "acquisition of test result" in step S40 are the same as the first embodiment shown in FIG. 2. After acquiring a result of the confirmation test, the diagnosis result determining unit 43*a* compares states of the network respectively signified by the fault diagnosis result and the test result of the confirmation test (step S150). When the diagnosis result determining unit 43*a* determines that there is no difference between the two states, the diagnosis result determining unit 43*a* delivers a report using a comparison result and the result of the fault diagnosis as output in the same manner as the first embodiment (step S160). On the other hand, when the diagnosis result determining unit 43*a* determines that there is a difference based on the state comparison, the diagnosis result determining unit 43*a* makes a determination to re-execute the fault diagnosis. In doing so, the diagnosis result determining unit 43*a* determines a necessity of an update of an inference process (step S170). The necessity of an update is determined based on, for example, a setting registered in the fault diagnosis apparatus 4*a* in advance.

Hereinafter, an operation example in a case where an update of the inference process is not need will be first described. In step S170, when the diagnosis result determining unit 43*a* determines that an update of the inference process is not needed, the diagnosis result determining unit 43a issues an instruction to the fault diagnosis unit 42 to execute a fault diagnosis once again (step S180).

The re-execution of the fault diagnosis may involve performing a diagnostic process from the beginning or, when the diagnostic process includes a plurality of steps, performing the diagnostic process from a step in which a difference had occurred in the state comparison. In the former re-execution of the fault diagnosis, there is a possibility that the state of the communication network 2 has changed with the passage of time and a correct diagnosis can be made by executing the same fault diagnosis once again. In addition, in the latter re-execution of the fault diagnosis, since computational processes that derive a same result can be omitted, computational resources can be streamlined. The fault diagnosis unit 42 performs the re-execution of the fault diagnoses and once again outputs a fault diagnosis result. Accordingly, the fault diagnosis apparatus 4a performs operations from step S10 in the flow shown in FIG. 4, executes a confirmation test, and compares states of the network respectively signified by the fault diagnosis result and the test result of the confirmation test.

When a state comparison between the fault diagnosis result and the test result reveals that a difference remains, the fault diagnosis apparatus 4a may repetitively perform operations of re-executing the fault diagnosis. In addition, the fault diagnosis apparatus 4a may repeat the re-execution of the fault diagnosis an arbitrary number of times set in advance and, when a result of the state comparison reveals that there is a difference, the fault diagnosis apparatus 4a may output contents to the effect that the comparison result does not indicate a match together with the fault diagnosis result and end the flow shown in FIG. 4 in a similar manner to the report operation in the first embodiment shown in FIG. 2. Furthermore, when re-executing the fault diagnosis, the fault diagnosis apparatus 4a may use not only information of NW monitoring but also information obtained in the confirmation test as input information.

A simple re-execution of a fault diagnosis involves executing the fault diagnosis from the beginning of diagnostic steps based on an original probabilistic model. With respect to a case where a diagnosis is started from a step midway through the diagnostic process, an operation example in a case where a Bayesian network is used as a probabilistic inference algorithm in the fault diagnosis unit 42 will now be described.

Figure 8:
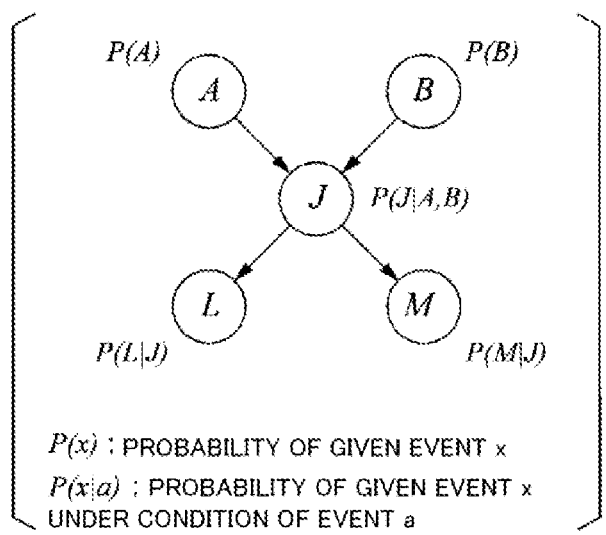
FIG. 8 is a diagram showing a simple example of a Bayesian network.

A case where a Bayesian network is used as the probabilistic inference algorithm in the fault diagnosis unit 42 will be described with reference to FIG. 8. In an initial inference calculation by the fault diagnosis unit 42, it is assumed that an event L and an event M are given state values of the events as an input, occurrence probabilities P (A|L, M) and P (B|L, M) of an event A and an event B are obtained using the state values, and whichever has a higher probability of the event A and the event B is to be reported as a fault diagnosis result. A state value is, for example, a value representing the presence or absence of an occurrence of an event or a value representing any state among a plurality of potential states that can be assumed by an event. Let us assume that a state evaluation based on a fault diagnosis result and a result of the confirmation test is performed by the diagnosis result determining unit 43a of the fault diagnosis apparatus 4a shown in FIG. 3 and that a difference is determined to have occurred. Let us assume that, as a result, the fault diagnosis apparatus 4a execute the fault diagnosis once again but a state of an event J is already obvious from the result of the confirmation test.

In this case, by calculating occurrence probabilities P (A|J) and P (B|J) of the event A and the event B using a state value of the event J as an input value instead of obtaining the probabilities of the events A and B using the state values of the events L and M as input values when performing a fault diagnosis, computational resources and a calculation time required by the diagnosis can be reduced.

Next, an operation example in a case where an update of the inference process is need will be described. In step S170, when the diagnosis result determining unit 43a determines that an update of the inference process is needed, the diagnosis result determining unit 43a issues an instruction to the inference process changing unit 45 to change contents of the inference process that is used by the fault diagnosis unit 42. The inference process changing unit 45 changes the inference process such that, from a process in which a difference had occurred between a fault diagnosis result by the fault diagnosis unit 42 and a network state signified by the test result of the confirmation test, a probability of reaching the fault diagnosis result matches the test result (step S190). The fault diagnosis unit 42 executes the fault diagnosis once again after the inference process is updated (step S180). The fault diagnosis unit 42 re-executes the fault diagnosis and once again outputs a fault diagnosis result. Accordingly, the fault diagnosis apparatus 4a performs operations from step S10 shown in FIG. 4, executes a confirmation test, and compares states of the network respectively signified by the fault diagnosis result and the test result of the confirmation test.

When a state comparison between the fault diagnosis result and the test result reveals that a difference remains, the fault diagnosis apparatus 4a may update the inference process once again and repetitively perform operations of re-executing the fault diagnosis. In addition, the fault diagnosis apparatus 4a may repeat the re-execution of the fault diagnosis an arbitrary number of times set in advance and, when a result of the state comparison reveals that there is a difference, the fault diagnosis apparatus 4a may output contents to the effect that the comparison result does not indicate a match together with the fault diagnosis result and end the flow shown in FIG. 4 in a similar manner to the report operation according to the first embodiment shown in FIG. 2. Furthermore, when re-executing the fault diagnosis, the fault diagnosis apparatus 4a may use not only information of NW monitoring but also information obtained in the confirmation test as input information.

Figure 5:
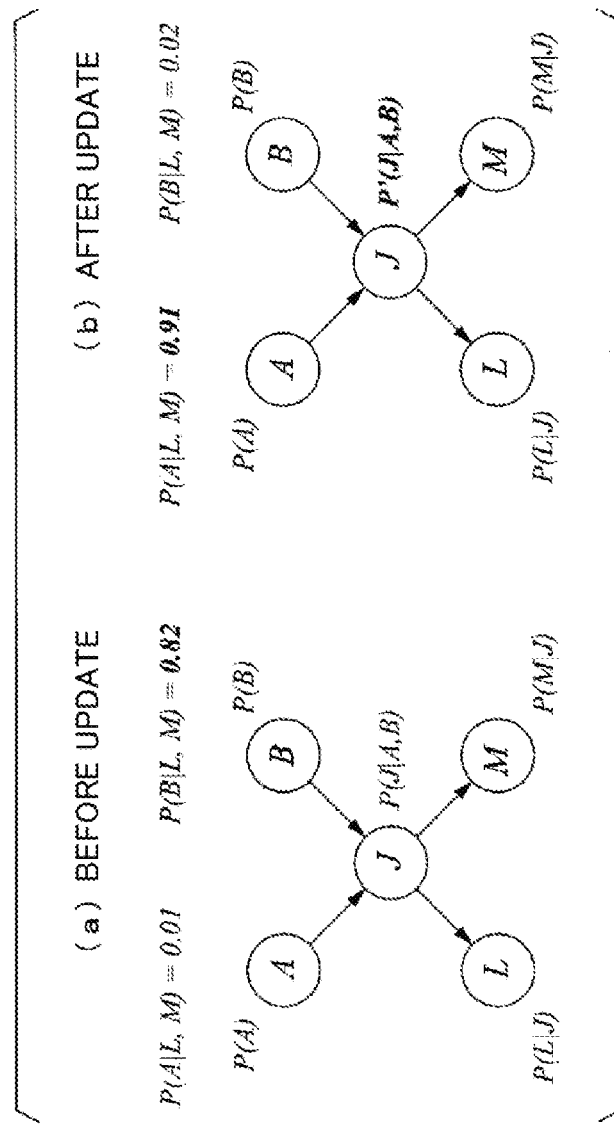
FIG. 5 is a diagram showing an update example of an inference process according to the second embodiment.

FIG. 5 is a diagram showing an update example of an inference process. A case where a Bayesian network is used as the probabilistic inference algorithm in the fault diagnosis unit 42 will be described with reference to FIG. 5. FIG. 5(a) is a diagram showing an inference process prior to an update. In an initial inference calculation by the fault diagnosis unit 42, it is assumed that an event L and an event M are given state values of the events as an input, occurrence probabilities P (A|L, M) and P (B|L, M) of an event A and an event B are obtained using the state values, and whichever has a higher probability (the event B) is to be reported as an output result. Let us assume that a state evaluation based on a fault diagnosis result and a result of a confirmation test is performed by the diagnosis result determining unit 43a of the fault diagnosis apparatus 4a shown in FIG. 3 and that a difference has occurred. As a result, when executing the fault diagnosis once again, the diagnosis result determining unit 43a makes a determination to update the inference process in the fault diagnosis unit 42.

FIG. 5(b) is a diagram showing an example of an update of the inference process having been performed by the inference process changing unit 45. In this example, the inference process changing unit 45 updates and changes a conditional probability P (J|A, B) of the event J to P' (J|A, B). The fault diagnosis unit 42 once again obtains occurrence probabilities of the events A and B based on the events L and M using the updated inference process (Bayesian network). After the update, since the occurrence probability of the event A indicates a high probability as shown in FIG. 5(*b*), the fault diagnosis unit 42 reports the event A as a new fault cause. Due to the inference process update function, even when an erroneous fault diagnosis is performed, the fault diagnosis may be performed once again together with a state confirmation of the network to arrive at identifying a true fault cause.

While only one conditional probability is changed in the update example of an inference process, any of nodes in a Bayesian network, any of probabilistic variables given to the nodes, and any of relationships among the nodes may be changed an arbitrary number of times. In addition, in diagnostic steps in the inference process after the update, a diagnosis may be started from a step in the middle of a diagnostic process.

While operation examples in which a necessity of an update of the inference process is fixed either way upon re-execution have been described above, alternatively, the diagnosis result determining unit 43*a* may make a determination on the necessity of an update every time a determination is required and individually determine whether or not an update is to be performed. In addition, the diagnosis result determining unit 43*a* may use a degree of deviation of a state comparison between a diagnosis result and a test result as a determination criterion when determining the necessity of an update.

Third Embodiment

The fault diagnosis system 1 according to the first embodiment shown in FIG. 1 and the fault diagnosis system 1*a* according to the second embodiment shown in FIG. 3 adopt a configuration that includes only one NW monitoring unit 41 and only one fault diagnosis unit 42. However, in an actual network operation, since a fault diagnosis must be performed from an enormous amount of monitoring information and, with an increase in the amount of information handled, problems such as an increase in computational resources and an increase in calculation time occur. The present embodiment solves such a problem of scalability.

Figure 6:
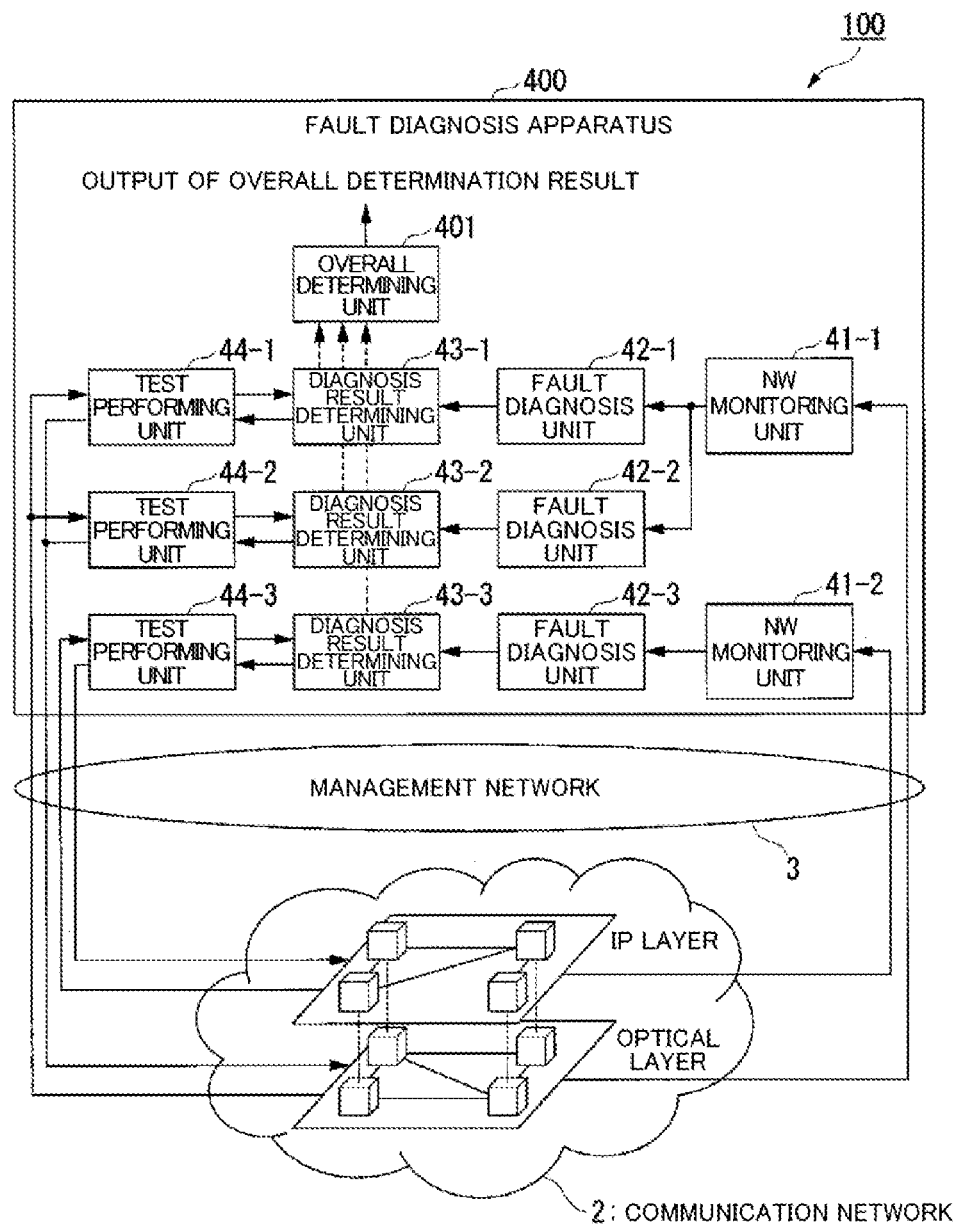
FIG. 6 is a configuration diagram of a fault diagnosis system according to a third embodiment.

FIG. 6 is a diagram showing a configuration example of a fault diagnosis system 100 according to the present embodiment. In FIG. 6, same portions as the fault diagnosis system 1 according to the first embodiment shown in FIG. 1 are denoted by same reference signs and descriptions thereof will be omitted. The fault diagnosis system 100 shown in FIG. 6 includes a fault diagnosis apparatus 400 instead of the fault diagnosis apparatus 4 shown in FIG. 1. The fault diagnosis apparatus 400 includes a plurality of NW monitoring units 41, a plurality of fault diagnosis units 42, a plurality of diagnosis result determining units 43, a plurality of test performing units 44, and an overall determining unit 401. Each of the plurality of NW monitoring units 41, the plurality of fault diagnosis units 42, the plurality of diagnosis result determining units 43, and the plurality of test performing units 44 have a similar function to the NW monitoring unit 41, the fault diagnosis unit 42, the diagnosis result determining unit 43, and the test performing unit 44 included in the fault diagnosis apparatus 4 according to the first embodiment. In FIG. 6, each of the plurality of NW monitoring units 41, the plurality of fault diagnosis units 42, the plurality of diagnosis result determining units 43, and the plurality of test performing units 44 is described as NW monitoring units 41-1, 41-2, . . . , fault diagnosis units 42-1, 42-2, . . . , diagnosis result determining units 43-1, 43-2, . . . , and test performing units 44-1, 44-2, . . . . In addition, although not illustrated, the fault diagnosis apparatus 400 includes one or more test item DBs 51 and one or more test result DBs 52. Furthermore, the communication network 2 has an IP layer and an optical layer.

For example, the fault diagnosis apparatus 400 is realized by a plurality of computer apparatuses. Which computer apparatus is to have which functional unit can be arbitrarily determined. Alternatively, one functional unit may be realized by a plurality of computer apparatuses. For example, each unit of the fault diagnosis apparatus 400 is a computational resource such as a group of servers or a cloud.

The overall determining unit 401 makes a determination of a fault diagnosis result by integrating determination information in the plurality of diagnosis result determining units 43 and information obtained by the NW monitoring units 41, the fault diagnosis units 42, and the test performing units 44. The NW monitoring unit 41-1 performs monitoring of the optical layer of the communication network 2 and the NW monitoring unit 41-2 performs monitoring of the IP layer of the communication network 2. The fault diagnosis units 42-1 and 42-2 correspond to the optical layer and perform a fault diagnosis based on information gathered by the NW monitoring unit 41-1. In addition, the fault diagnosis unit 42-3 corresponds to the IP layer and performs a fault diagnosis based on information gathered by the NW monitoring unit 41-2. Operations by the diagnosis result determining unit 43-*i* and the test performing unit 44-*i* (i=1, 2, 3) for determining a fault diagnosis result by the fault diagnosis unit 42-*i*, performing a confirmation test, comparing states between the fault diagnosis result and the confirmation test result are similar to those of the first embodiment.

A target by which monitoring of the communication network 2 is to be divided may be set to an arbitrary monitoring unit such as per layer, per installation area, or per service. In addition, gathered information of one NW monitoring unit 41 may be used by a plurality of fault diagnosis units 42 and, conversely, one fault diagnosis unit 42 may perform a fault diagnosis by acquiring monitoring information from a plurality of NW monitoring units 41.

While FIG. 6 shows a mode in which each of the test performing units 44-1, 44-2, . . . performs a confirmation test only with respect to a corresponding layer, one test performing unit 44 may perform a confirmation test with respect to a plurality of layers. A plurality of fault diagnosis results are reported from the respective diagnosis result determining units 43 to the overall determining unit 401. The overall determining unit 401 comprehensively determines a state of the communication network 2 and a presence or absence of a fault (when there is a fault, a cause thereof) from the reported contents and outputs the determined state and the determined presence or absence. Adopting such a mode not only ensures scalability of the present embodiment but also enables a state of the entire network to be finally comprehended while executing a fault diagnosis of the network according to rules based on a policy of a maintenance operator such as a unit of monitoring. The unit of monitoring refers to a service unit, a communication unit, a provision area unit, or the like. While an adaptation example according to the first embodiment has been described above with reference to FIG. 6, an adaptation to the second embodiment may be performed in a similar manner.

According to the embodiment described above, since the fault diagnosis system has means for confirming whether or not a fault has occurred on an actual network based on a diagnosis result of a fault diagnosis, more accurate fault diagnosis can be performed. Therefore, a diagnosis result no longer needs to be separately confirmed and an error in a diagnosis result can be comprehended before a fault response.

Functions of the fault diagnosis apparatuses 4, 4a, and 400 in the embodiments described above may be realized by a computer. In this case, a program for realizing the functions may be recorded in a computer-readable recording medium and the program recorded in the recording medium may be loaded to and executed by a computer system. It is assumed that a "computer system" as used herein includes an OS and hardware such as peripheral devices. In addition, a "computer-readable recording medium" refers to a portable medium such as a flexible disk, a magneto-optical disk, a ROM, or a CD-ROM or a storage apparatus such as a hard disk that is built into the computer system. Furthermore, a "computer-readable recording medium" may also include a recording medium that dynamically holds a program for a short period of time such as a communication wire when the program is to be transmitted via a network such as the Internet or a communication line such as a telephone line as well as a recording medium that holds a program for a certain period of time such as a volatile memory inside a server or a computer system to become a client. In addition, the program described above may be a program for realizing a part of the functions described above or a program capable of realizing the functions described above in combination with a program already recorded in a computer system.

According to the embodiments described above, a diagnostic apparatus includes a state estimating unit, a test performing unit, and a determining unit. For example, the diagnostic apparatus is the fault diagnosis apparatuses 4, 4a, and 400. The state estimating unit estimates a state of a diagnostic target that may assume one or more states using a probabilistic inference algorithm having one or more probabilistic inference steps. For example, the state estimating unit is the fault diagnosis unit 42, and a state estimation algorithm using a Bayesian network having inter-node conditional probability variables is used as the probabilistic inference algorithm having one or more probabilistic inference steps. In addition, for example, when a diagnostic target is a communication network, the state estimating unit estimates a state in which a fault has occurred in the communication network. The test performing unit performs a verification test for verifying a state having been estimated by the state estimating unit. The determining unit determines a likelihood of the state having been estimated by the state estimating unit based on a test result of a verification test performed by the test performing unit. For example, the determining unit is the diagnosis result determining units 43 and 43a.

When the determining unit determines that there is a difference between a state of a diagnostic target obtained based on a test result of a verification test and a state estimated by the state estimating unit, the determining unit makes a transition to a probabilistic inference step in which the difference had occurred and instructs the state estimating unit to estimate a state of the diagnostic target. In addition, the diagnostic apparatus may further include an inference process changing unit which corrects a probability of reaching the state estimated by the state estimating unit so as to match the test result of the verification test from the probabilistic inference step in which the difference had occurred.

In addition, the diagnostic apparatus may include a plurality of combinations of one or more of the state estimating units, one or more of the test performing units, and one or more of the determining units. In this case, the diagnostic apparatus further includes an overall determining unit which determines the state of the diagnostic target using a state estimated by the state estimating unit and a result of a determination made with respect to the estimated state by the determining unit in each of the combinations.

The diagnostic apparatus may be implemented using a plurality of information processing apparatuses connected via a network so as to be capable of communication. In this case, each functional unit included in the diagnostic apparatus may be implemented in a distributed manner across a plurality of information processing apparatuses. For example, the state estimating unit, the test performing unit, and the determining unit may be respectively implemented in different information processing apparatuses.

While embodiments of the present invention have been described in detail with reference to the drawings, it is to be understood that specific configurations are not limited to these embodiments and includes designs and the like which do not constitute departures from the gist of the present invention.

INDUSTRIAL APPLICABILITY

The present invention can be utilized in fault diagnosis and abnormality diagnosis of a communication network.

REFERENCE SIGNS LIST

1, 1a, 100 Fault diagnosis system
2 Communication network
3 Management network
4, 4a, 400 Fault diagnosis apparatus
41, 41-1, 41-2 NW monitoring unit
42, 42-1, 42-2, 42-3 Fault diagnosis unit
43, 43a, 43-1, 43-2, 43-3 Diagnosis result determining unit
44, 44-1, 44-2, 44-3 Test performing unit
45 Inference process changing unit
51 Test item DB
52 Test result DB
401 Overall determining unit

The invention claimed is:

1. A diagnostic apparatus, comprising:
a processor; and
a storage medium having computer program instructions stored thereon, when executed by the processor, perform to:
estimate a state of a diagnostic target using a probabilistic inference algorithm having one or more probabilistic inference steps,
wherein the probabilistic inference algorithm includes a Bayesian network having inter-node conditional probability variables, and
wherein the diagnostic target is a communication network;
perform a verification test for verifying the estimated state,
the verification test including, in response to diagnosis of a fault in a first apparatus of the communication network, (1) confirming the state of the first apparatus in the communication network via a management network, (2) issuing an instruction to a second apparatus via the management network and causing communication confirmation to be executed from the second apparatus to the first apparatus, (3) acquiring alert information of the first apparatus, and determining a test result of the verification test based on results of (1), (2), and (3);

determine a likelihood of the estimated state based on the test result of the verification test; and adjust the probabilistic inference algorithm based on a comparison of the estimated state and the test result of the verification test.

2. The diagnostic apparatus according to claim 1, wherein the computer program instructions further perform to, upon a determination that there is a difference between the test result of the verification test and the estimated state, makes a transition to the probabilistic inference step in which the difference had occurred and estimate a state of the diagnostic target.

3. The diagnostic apparatus according to claim 1, wherein the computer program instructions further perform to, upon a determination that there is a difference between the test result of the verification test and the estimated state, corrects a probability of reaching the estimated state so as to match the test result from the probabilistic inference step in which the difference had occurred.

4. The diagnostic apparatus according to claim 1, comprising a plurality of combinations of one or more of state estimating units, one or more of the test performing units, and one or more of determining units, and further comprising an overall determining unit that determines the state of the diagnostic target using a state estimated by a state estimating unit and a result of a determination made with respect to the state by a determining unit in each of the combinations.

5. The diagnostic apparatus according to claim 1, wherein computer program instructions further estimate a state in which a fault has occurred in the communication network.

6. The diagnostic apparatus according to claim 1, wherein the computer program instructions further, when a difference exists between the test result and the estimated state, adjust one or more components of the probabilistic inference algorithm thereby correcting a probability of reaching the estimated state so as to match the test result from the probabilistic inference step in which the difference occurred.

* * * * *